(12) United States Patent
Chan

(10) Patent No.: US 7,280,370 B2
(45) Date of Patent: Oct. 9, 2007

(54) ELECTRONIC PACKAGE AND CIRCUIT BOARD HAVING SEGMENTED CONTACT PADS

(75) Inventor: Aik Huang Chan, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 9 days.

(21) Appl. No.: 11/213,141

(22) Filed: Aug. 26, 2005

(65) Prior Publication Data
US 2007/0044998 A1   Mar. 1, 2007

(51) Int. Cl.
*H05K 7/12* (2006.01)
*H05K 7/00* (2006.01)

(52) U.S. Cl. .............. 361/767; 174/260; 361/772; 361/777; 361/782; 361/783

(58) Field of Classification Search ........ 174/260–261; 361/767–779, 782, 783
See application file for complete search history.

(56) References Cited

U.S. PATENT DOCUMENTS

| | | | |
|---|---|---|---|
| 4,991,666 A * | 2/1991 | Septfons et al. ........... 174/261 |
| 5,081,520 A | 1/1992 | Yoshii et al. |
| 5,425,647 A * | 6/1995 | Mencik et al. .............. 439/83 |
| 5,523,620 A | 6/1996 | Eytcheson et al. |
| 5,930,601 A | 7/1999 | Cannizzaro et al. |
| 5,949,654 A * | 9/1999 | Fukuoka ................. 361/760 |
| 6,054,765 A | 4/2000 | Eytcheson et al. |
| 6,436,730 B1 | 8/2002 | Melton et al. |
| 6,566,164 B1 | 5/2003 | Glenn et al. |
| 6,730,860 B2 * | 5/2004 | Searls et al. ............. 174/261 |
| 2002/0125043 A1 * | 9/2002 | Yoshida .................. 174/261 |
| 2003/0113954 A1 | 6/2003 | Glenn et al. |
| 2005/0287699 A1 | 12/2005 | Brauer |

FOREIGN PATENT DOCUMENTS

| | | |
|---|---|---|
| JP | 6181400 | 6/1994 |
| JP | 9102665 | 4/1997 |

OTHER PUBLICATIONS

EP Search Report dated Dec. 4, 2006.

* cited by examiner

*Primary Examiner*—Dean A. Reichard
*Assistant Examiner*—Jeremy C. Norris
(74) *Attorney, Agent, or Firm*—Jimmy L. Funke

(57) ABSTRACT

An electronic package has a circuit board including a substrate electrical circuitry including circuit traces and first and second contacts for connecting to surface mount device(s). The first and second contacts each have multiple components including first and second pads. The first pad is separate from the second pad to allow for low cost and easy testing of the electrical circuit.

2 Claims, 2 Drawing Sheets

ELECTRONIC PACKAGE AND CIRCUIT BOARD HAVING SEGMENTED CONTACT PADS

TECHNICAL FIELD

The present invention generally relates to electronic surface mount device assemblies and, more particularly, relates to connecting a surface mount device to electrical contact pads on a circuit board.

BACKGROUND OF THE INVENTION

Electronic packages (modules) generally employ circuit components mounted onto a circuit board, such as a printed circuit board. Prior to use in an application, the electronic package is typically tested to ensure that the circuit board components are present and function properly. Testing for the presence and proper operation of circuit board components may include visual inspection to ensure that the components are present in the desired location. Visual inspection may be performed manually or automatically with visual recognition equipment. However, visual inspection approaches generally require sophisticated visual recognition equipment and/or are generally time consuming.

Other circuit board component testing include applying an in-circuit test to verify that the electrical connection and operation of the discrete electronic components soldered onto the circuit board are operational. This may be achieved by testing components, individually or as a group, by applying electrical signals across test probes and measuring the output of individual integrated circuit components, an output of a group of components or the output of the entire circuit as a whole. However, in some circuit arrangements, it is often difficult to effectively test for the presence and operation of circuit components.

One example of a conventional electronic package with a circuit arrangement that may be difficult to properly test with conventional testing techniques is shown in FIG. 1 labeled 110. Package 110 has a circuit including electrically conductive elements formed on a circuit board generally shown by reference identifier 136. The circuit is shown having a power supply 112, circuit traces 120 and integrated circuits 118A–118N. Additionally, the circuit includes surface mount electronic devices including a large bulk capacitor 114 and a series of bypass capacitors 116A and 116B. The circuit is further shown missing a bypass capacitor 116N.

The conventional circuit configuration for connecting the surface mount components onto the circuit board 136 typically employs first and second contact pads 122 and 124 formed on the surface of the circuit board 136. The surface mount components, such as bypass capacitors 116A and 116B are each soldered at first and second terminals. The first terminal of the surface mount device is soldered to the first contact pad 122 and the second terminal is soldered to the second contact pad 124.

When employing small bypass capacitors 116A, 116B in combination with a large bulk capacitor 114, the omission of any one of the small bypass capacitors generally may not be easily detected by an operational in-circuit test. As a consequence, if one of the bypass capacitors 116A, 116B is missing, the electronic package 110 may fail and/or suffer in performance which may adversely affect the resulting circuit application.

It is therefore desirable to provide for a circuit board component connection that allows for low cost and effective testing of electronic surface mount electronic components on the circuit board.

SUMMARY OF THE INVENTION

In accordance with the teachings of the present invention, an electronic package and circuit board for connecting to one or more surface mount electronic devices is provided having multiple component mounting pads. The circuit board has a substrate and electrical circuitry formed on the substrate and including circuit traces and first and second contacts. The first contact has a first pad electrically isolated from a second pad. A surface mount device having first and second terminals is adapted to connect to the first and second contacts, such that one terminal contacts both the first and second pads. The multiple component pads enable enhanced testing capability of the circuit.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
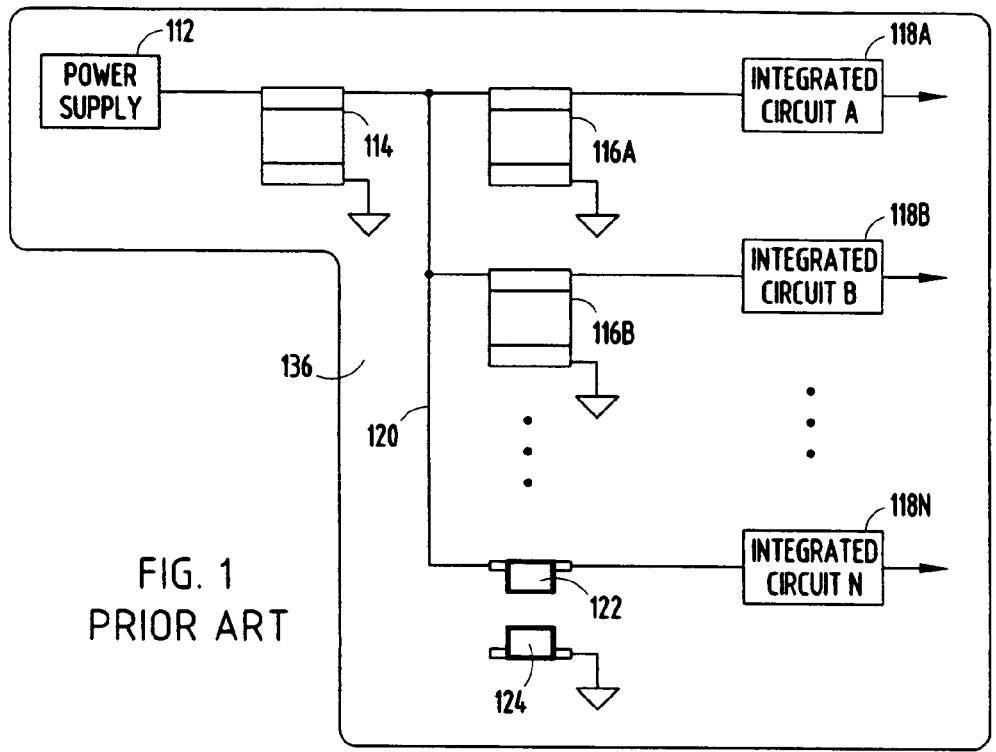
FIG. 1 is a block/circuit diagram illustrating an electronic package with a circuit arrangement employing conventional contacts.
Figure 2:
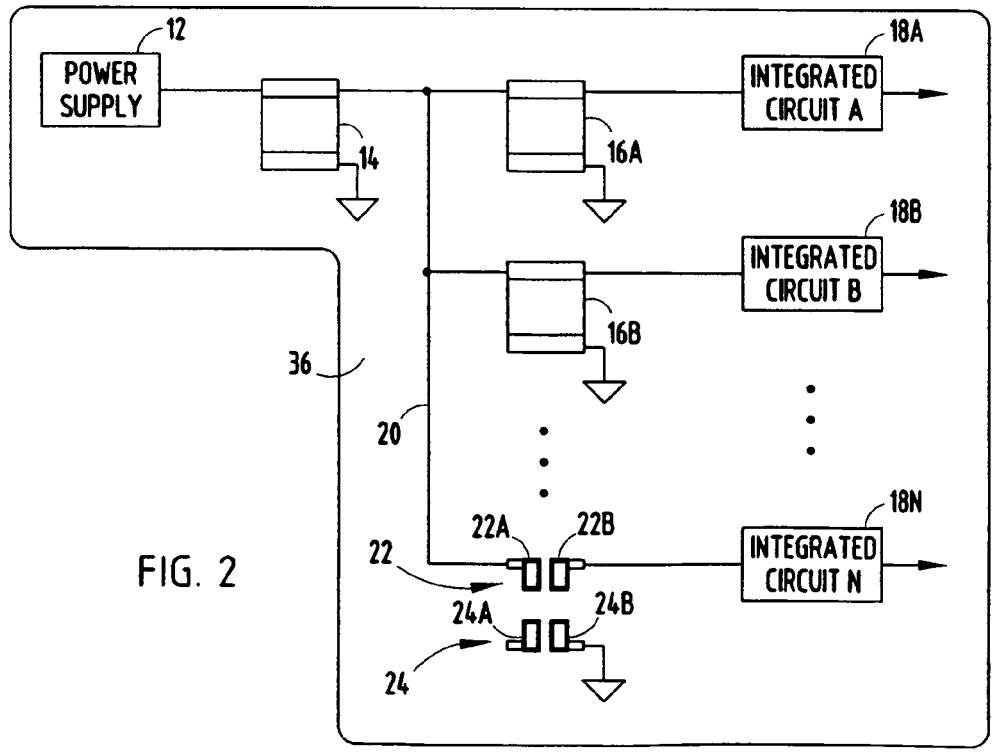
FIG. 2 is a block/circuit diagram illustrating an electronic package with a circuit arrangement employing multiple component contacts according to one embodiment of the present invention.

Referring now to FIG. 2, an electronic package 10 is generally illustrated having surface mount devices (components) connected to a circuit board according to one embodiment of the present invention. The electronic package 10 is configured with electrical circuit connections that allow for quick, low cost and effective testing of electronic surface mount components on the circuit board. While an exemplary circuit arrangement is shown and described herein, it should be appreciated that the circuit connections may be applicable to various other circuit arrangements.

Electronic package 10 has a circuit board 36 generally including a dielectric substrate and electrically conductive elements formed on the circuit board 36. The circuit board 36 may include a printed circuit board having printed circuit traces 20 fabricated on the top surface. Additionally, the circuit board 36 may have circuit traces fabricated on the bottom surface and any intermediate layers.

The electronic package 32 is generally shown having a power supply 12, circuit traces 20 and integrated circuits 18A–18N located on the circuit board 36, according to an illustrative example. Additionally, the electronic package 10 includes surface mount electronic devices mounted on the circuit board 12. The surface mount electronic devices shown in the exemplary embodiment include a large bulk capacitor 14 and a series of bypass capacitors 16A and 16B. The electronic package 10 is further shown missing a surface mount electronic device, namely a bypass capacitor 16N.

The surface mount electronic components are connected to multiple component contacts 22 and 24 that are formed as multiple isolated segments. Each contact 22 and 24 includes at least first and second contact pads, namely pads 22A and 22B for contact 22 and pads 24A and 24B for contact 24, formed on the circuit board 36. A surface mount component, such as bypass capacitor 16, is soldered via its first and second terminals to connect to the respective first and second contacts 22 and 24.

Figure 3:
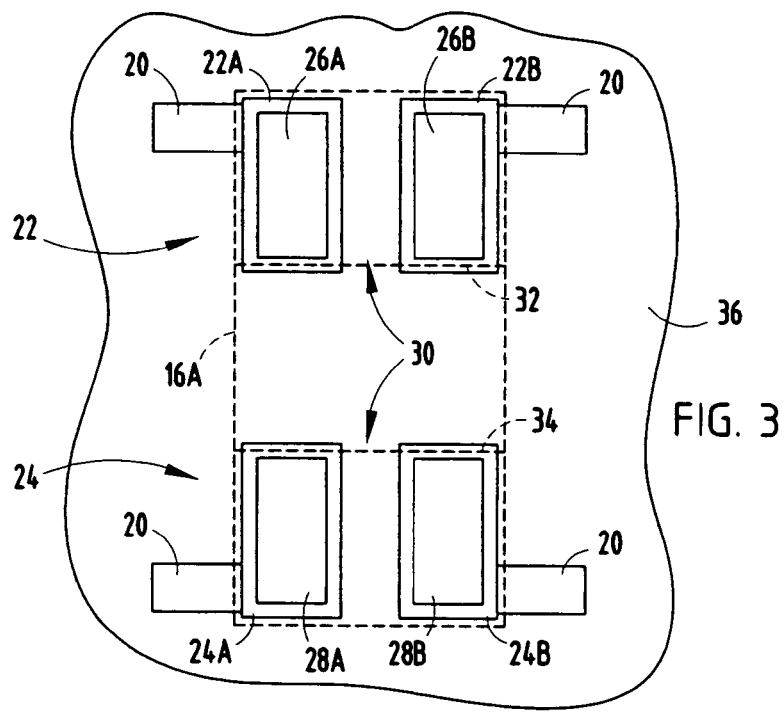
FIG. 3 is an enlarged view of a set of multiple component contacts shown in FIG. 2.

It should be appreciated that each of the surface mount devices, including bulk capacitor 14 and each of the bypass capacitors 16A and 16B includes a pair of terminals which are connected to corresponding contacts on the printed circuit board 36. The contacts 22 and 24 are illustrated in more detail in FIGS. 3 and 4 each having multiple component rectangular contact pads. Specifically, the first contact 22 includes first and second contact pads 22A and 22B. Disposed within each of contact pads 22A and 22B is solder paste 26A and 26B, respectively. The first contact pad 22A is connected to circuit trace 20 and is dielectrically isolated from the second contact 22B which is also connected to circuit trace 20. Further, the first and second contact pads 22A and 22B are formed on circuit board 36, such that the connecting circuit traces 20 are electrically open-circuited to prevent current flow across the first and second pads 22A and 22B when the corresponding connecting terminal of the surface mount device is not connected thereto.

The second contact 24 is similarly shown including multiple isolated component pads having a first contact pad 24A and a second contact pad 24B. First contact pad 24A is dielectrically isolated from the second contact pad 24B, which is connected to ground. Disposed on each of first and second contact pads 24A and 24B is solder paste 28A and 28B, respectively.

It should be appreciated that the first and second pads 22A and 22B are spaced from each other via dielectric isolation region 30. Similarly, the third and fourth contact pads 24A and 24B are dielectrically spaced from each other via dielectric region 30. By forming each of the first and second contacts 22 and 24, each as multiple component contact pads that are isolated from each other, the corresponding first and second contacts 22 and 24 are each open-circuited when the corresponding terminals of a surface mount device are not connected thereto. When the first and second terminals 32 and 34 of surface mount device 16A are connected to first and second contacts 22 and 24, respectively, the terminals 32 and 34 serve as an electrically conductive path that bridges the gap 30 between pads 22A and 22B and also between pads 24A and 24B.

Figure 4:
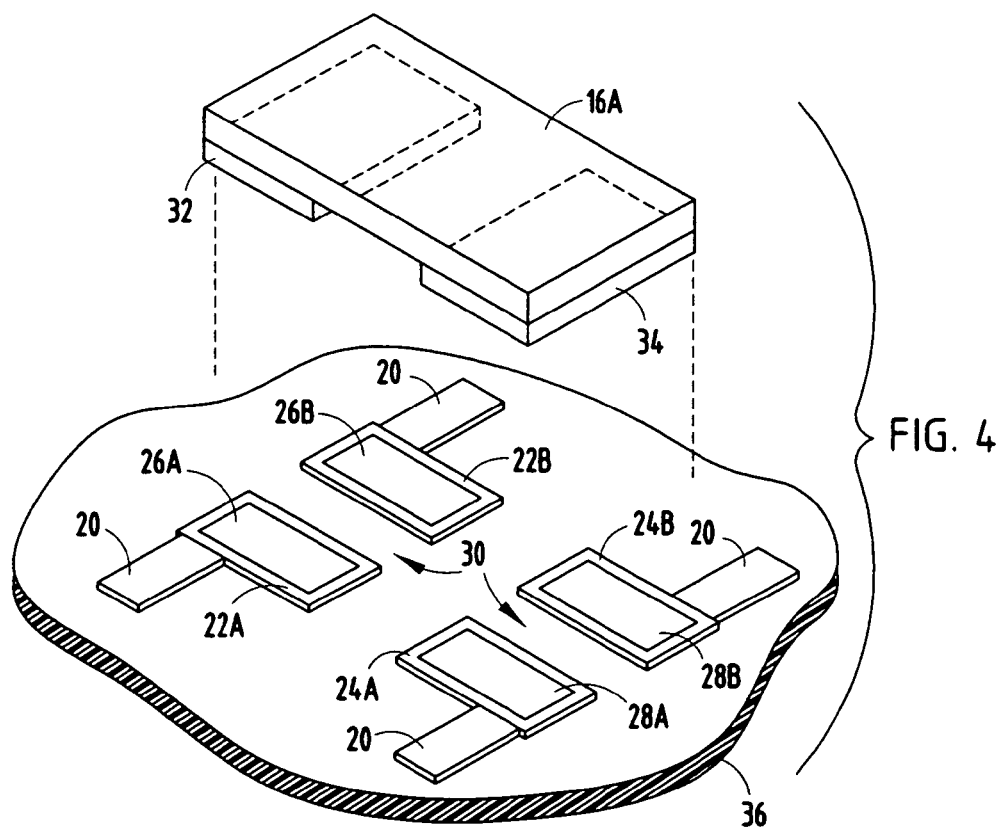
FIG. 4 is an exploded view of an electronic surface mount component (e.g., capacitor) connected to the multiple component contacts on a circuit board.

With particular reference to FIG. 4, a surface mount device 16A is shown configured to contact the first and second contacts. In doing so, the first and second terminals 32 and 34 of surface mount device 16A are brought into contact with the first and second contacts 22 and 24 on the circuit board 36. When the surface mount device 16A is connected to circuit board 36, the first and second terminals 32 and 34 are brought into contact with the first and second contacts 22 and 24, respectively. In doing so, first terminal 32 contacts both the first and second pads 22A and 22B via the solder paste 26A and 26B. The first terminal 32 thereby contacts both contact pads 22A and 22B via solder paste 26A and 26B to provide a closed-circuit electrical connection therebetween. Similarly, the second terminal 34 contacts both mounting pads 24A and 24B via solder paste 28A and 28B to form a closed circuit electrical connection between the two pads 24A and 24B.

The electronic package 10 and the circuit board 36 of the present invention advantageously allow for testing of the circuit components to determine if the circuit components are present and functioning properly prior to use for a given application. In doing so, a functional test may be employed to verify the electrical connection operation of the discrete surface mount devices. Alternately, the in-circuit test may be employed by checking electrical continuity on circuit traces that connect a group of surface mount devices.

When a surface mount device is properly connected to circuit 36, the surface mount component terminals 32 and 34 form a closed circuit electrical connection across the multiple component contacts so that current flows between first and second contact pads 22A and 22B and third and fourth contact pads 24A and 24B. By applying voltage across the contacts 22 and 24, the test may determine connection of the surface mount device. Whenever the surface mount device is not connected, no signal will be present at the inputs of integrated circuit N 18N and hence no signal will appear at the outputs of integrated circuit N 18N, indicative of a missing surface mount component.

While the electronic package 10 and the circuit board 36 are shown and described herein in connection with contacts 22 and 24 having first and second contact pads, it should be appreciated that the contacts 22 and 24 may each be segmented into any of a number of contact pads including three or more pads, without departing from the teachings of the present invention. Additionally, while rectangular contact pads are generally shown and described herein, it should be appreciated that any of a number of shapes (e.g., circular, semi-circular, T-shape, etc.) and size contact pads may be employed to provide electrical connection to the terminals of a surface mount device and enable testing for presence and operation of the surface mount device. Further, the multiple component contact arrangement of the present invention may be applicable to any of a wide variety of electrical circuits, and is not limited to the connection of a surface mount capacitor onto a printed circuit board as shown.

The electronic package 10 and circuit board 36 of the present invention advantageously improves the transparent to test characteristics, reduces the in-circuit test time and expense, and eliminates the need for visual inspections and allows for easy detection of missing surface mount components.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronic package comprising:
   a circuit board comprising a substrate and one or more integrated circuits formed on the substrate;
   for each of the one or more integrated circuits, first and second contacts formed on the circuit board for electrically coupling the integrate circuit to a surface mount bypass capacitor, wherein (1) the first contact comprises first and second pads such that the first pad is electrically isolated from the second pad, (2) the first pad is electrically coupled to an electrical power supply, (3) the second pad is electrically coupled to the integrated circuit, and (4) no separate test contacts for continuity testing of the first and second pads are present on the substrate adjacent the pads; and for each of the one or more integrated circuits, a surface mount bypass capacitor comprising first and second terminals, wherein the first terminal is connected to both the first and second pads of the first contact and the second terminal is connected to the second contact, whereby the presence of the surface mount capacitor is indicated by a functional test of the integrated circuit.

2. The electronic package as defined in claim 1, wherein, for at least one of the one or more integrated circuits, (1) the second contact comprises third and fourth pads, (2) one of the third and fourth pads is grounded with respect to the power supply, (3) the third pad is electrically isolated from the fourth pad, and (4) the second terminal of the surface mount bypass capacitor is connected to both the third and fourth pads.

* * * * *